US010991819B2

(12) United States Patent
Liu et al.

(10) Patent No.: US 10,991,819 B2
(45) Date of Patent: Apr. 27, 2021

(54) HIGH ELECTRON MOBILITY TRANSISTORS

(71) Applicant: Taiwan Semiconductor Manufacturing Co., Ltd., Hsin-Chu (TW)

(72) Inventors: Po-Chun Liu, Hsinchu (TW); Chung-Yi Yu, Hsin-Chu (TW); Chi-Ming Chen, Zhubei (TW); Chen-Hao Chiang, Jhongli (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/132,793

(22) Filed: Sep. 17, 2018

(65) Prior Publication Data
US 2019/0013399 A1 Jan. 10, 2019

Related U.S. Application Data (63) Continuation of application No. 15/242,653, filed on Aug. 22, 2016, now Pat. No. 10,109,729, which is a (Continued)

(51) Int. Cl.
*H01L 29/778* (2006.01)
*H01L 29/66* (2006.01)
(Continued)

(52) U.S. Cl.
CPC ...... *H01L 29/7787* (2013.01); *H01L 29/2003* (2013.01); *H01L 29/205* (2013.01);
(Continued)

(58) Field of Classification Search
CPC ............. H01L 29/432; H01L 29/66462; H01L 29/7783; H01L 29/201; H01L 29/2003; H01L 29/7787; H01L 29/205
(Continued)

(56) References Cited

U.S. PATENT DOCUMENTS 6,064,082 A * 5/2000 Kawai ................ H01L 29/7783
257/191
8,436,398 B2 5/2013 Lidow et al.
(Continued)

FOREIGN PATENT DOCUMENTS

CN 102365745 A 2/2012
CN 102881715 A 1/2013

OTHER PUBLICATIONS

Non-Final Office Action dated Sep. 29, 2014 for U.S. Appl. No. 13/745,925.
(Continued)

*Primary Examiner* — Mohammed Shamsuzzaman
*Assistant Examiner* — Aaron J Gray
(74) *Attorney, Agent, or Firm* — Eschweiler & Potashnik, LLC (57) ABSTRACT

The present disclosure, in some embodiments, relates to a transistor device. The transistor device includes a layer of GaN over a substrate. A mobility-enhancing layer of $Al_zGa_{(1-z)}N$ is over the layer of GaN and has a first molar fraction z in a first range of between approximately 0.25 and approximately 0.4. A resistance-reducing layer of $Al_xGa_{(1-x)}N$ is over the mobility-enhancing layer and has a second molar fraction x in a second range of between approximately 0.1 and approximately 0.15. A source has a source contact and an underlying source region. A drain has a drain contact and an underlying drain region. The source and drain regions extend through the resistance-reducing layer of $Al_xGa_{(1-x)}N$ and into the mobility-enhancing layer of $Al_zGa_{(1-z)}N$. The source and drain regions have bottoms over a bottom of the mobility-enhancing layer of $Al_zGa_{(1-z)}N$. A gate structure is laterally between the source and drain contacts.

20 Claims, 13 Drawing Sheets

Related U.S. Application Data continuation of application No. 13/745,925, filed on Jan. 21, 2013, now Pat. No. 9,425,276.

(51) Int. Cl.
*H01L 29/20* (2006.01)
*H01L 29/201* (2006.01)
*H01L 29/205* (2006.01)
*H01L 29/43* (2006.01)

(52) U.S. Cl.
CPC ...... *H01L 29/432* (2013.01); *H01L 29/66462* (2013.01); *H01L 29/7783* (2013.01); *H01L 29/201* (2013.01)

(58) Field of Classification Search
USPC ........... 257/194, 76, 201, E29.253, E21.407, 257/E29.246; 438/172
See application file for complete search history.

(56) References Cited

U.S. PATENT DOCUMENTS

| | | | |
|---|---|---|---|
| 2002/0167023 A1 | 11/2002 | Chavarkar et al. | |
| 2003/0218183 A1 | 11/2003 | Micovic et al. | |
| 2004/0016965 A1* | 1/2004 | Ui | H01L 29/1029 257/335 |
| 2006/0220165 A1* | 10/2006 | Hase | H01L 29/7785 257/471 |
| 2007/0045670 A1 | 3/2007 | Kuraguchi | |
| 2008/0197359 A1 | 8/2008 | Imanishi et al. | |
| 2009/0008678 A1* | 1/2009 | Ando | H01L 29/7787 257/194 |
| 2010/0255841 A1 | 10/2010 | Kubo et al. | |
| 2011/0057232 A1* | 3/2011 | Sheppard | H01L 29/7787 257/194 |
| 2011/0079822 A1* | 4/2011 | Kanamura | H01L 29/66462 257/192 |
| 2011/0227093 A1* | 9/2011 | Hikita | H01L 29/41766 257/76 |
| 2011/0272742 A1* | 11/2011 | Akiyama | H01L 29/66431 257/194 |
| 2011/0284865 A1* | 11/2011 | Inoue | H01L 29/41766 257/76 |
| 2012/0126287 A1* | 5/2012 | Aoki | H01L 29/7787 257/192 |
| 2014/0106516 A1* | 4/2014 | Curatola | H01L 29/7787 438/172 |

OTHER PUBLICATIONS

Final Office Action dated Apr. 14, 2015 for U.S. Appl. No. 13/745,925.
Non-Final Office Action dated Sep. 30, 2015 for U.S. Appl. No. 13/745,925.
Notice of Allowance dated Apr. 25, 2016 for U.S. Appl. No. 13/745,925.
Non-Final Office Action dated Mar. 7, 2017 for U.S. Appl. No. 15/242,653.
Final Office Action dated Aug. 11, 2017 for U.S. Appl. No. 15/242,653.
Non-Final Office Action dated Dec. 15, 2017 for U.S. Appl. No. 15/242,653.
Notice of Allowance dated Jun. 13, 2018 for U.S. Appl. No. 15/242,653.

* cited by examiner

HIGH ELECTRON MOBILITY TRANSISTORS

REFERENCE TO RELATED APPLICATION

This Application is a Continuation of U.S. application Ser. No. 15/242,653, filed on Aug. 22, 2016, which is a Continuation of U.S. application Ser. No. 13/745,925 filed on Jan. 21, 2013 (now U.S. Pat. No. 9,425,276, issued on Aug. 23, 2016). The contents of the above-referenced Patent Applications are hereby incorporated by reference in their entirety.

BACKGROUND

High electron mobility transistors (HEMTs) are utilized in integrated circuits for high-frequency applications due to their high efficiency relative to other power semiconductor devices such as insulated gate bipolar transistors and thyristors. HEMTs utilize a heterojunction between two semiconducting materials with different band gaps to form a device channel, instead of a doped region as in a metal oxide semiconductor field-effect transistor (MOSFET). Two exemplary materials used to form the heterojunction within a HEMT are a doped wide-bandgap n-type donor layer of $Al_xGa_{(1-x)}N$ coupled to an un-doped narrow-bandgap channel layer of GaN. Ohmic contacts formed to the AlGaN donor layer are subject to increased contact resistance as the Al concentration of the AlGaN donor is increased. Conversely, reducing the concentration of the AlGaN donor layer improves the contact resistance, but degrades electron mobility within the channel.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Figure 1A:
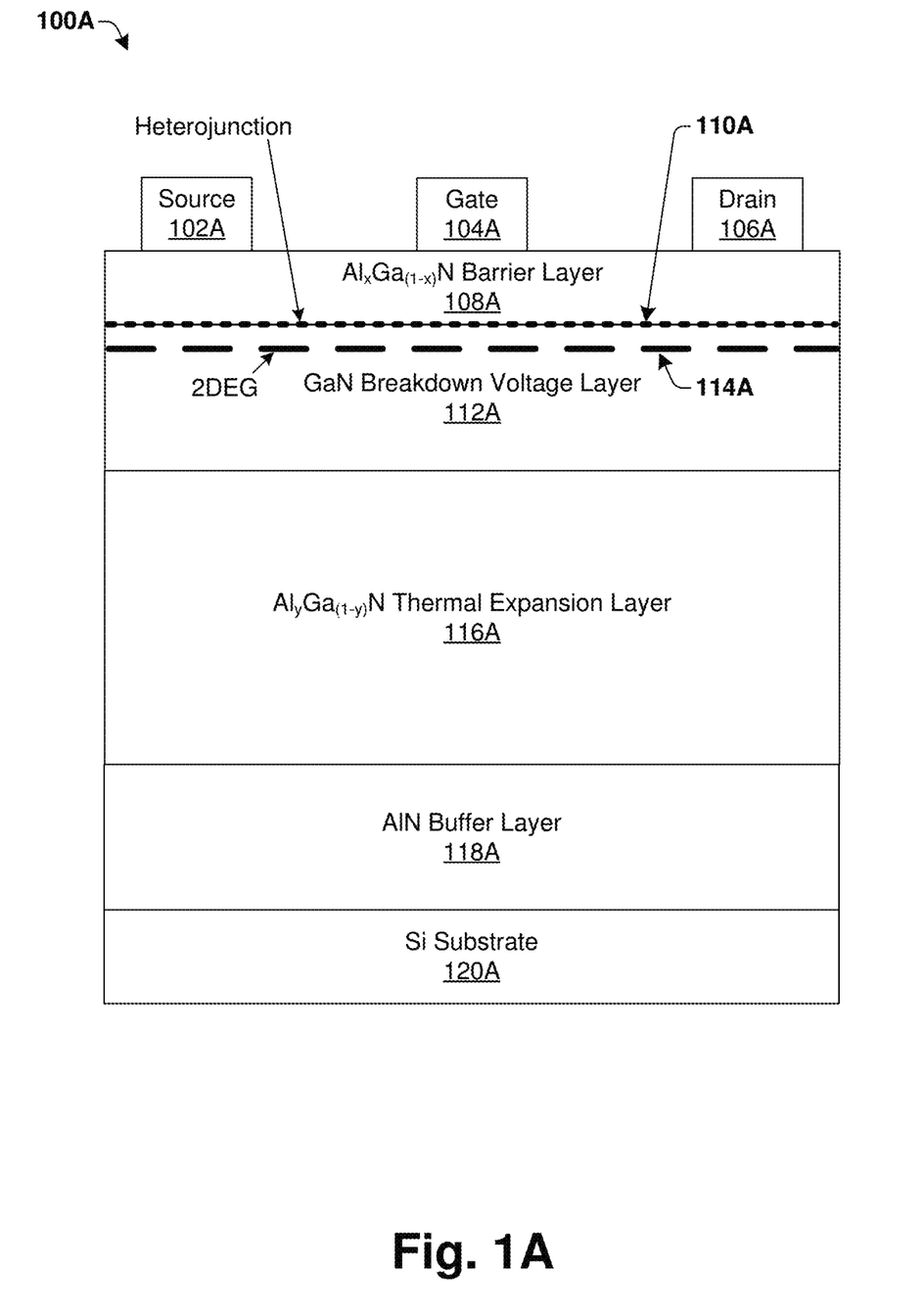
FIG. 1A illustrates a cross-sectional view of a transistor comprising a donor layer of $Al_xGa_{(1-x)}N$.
Figure 1B:
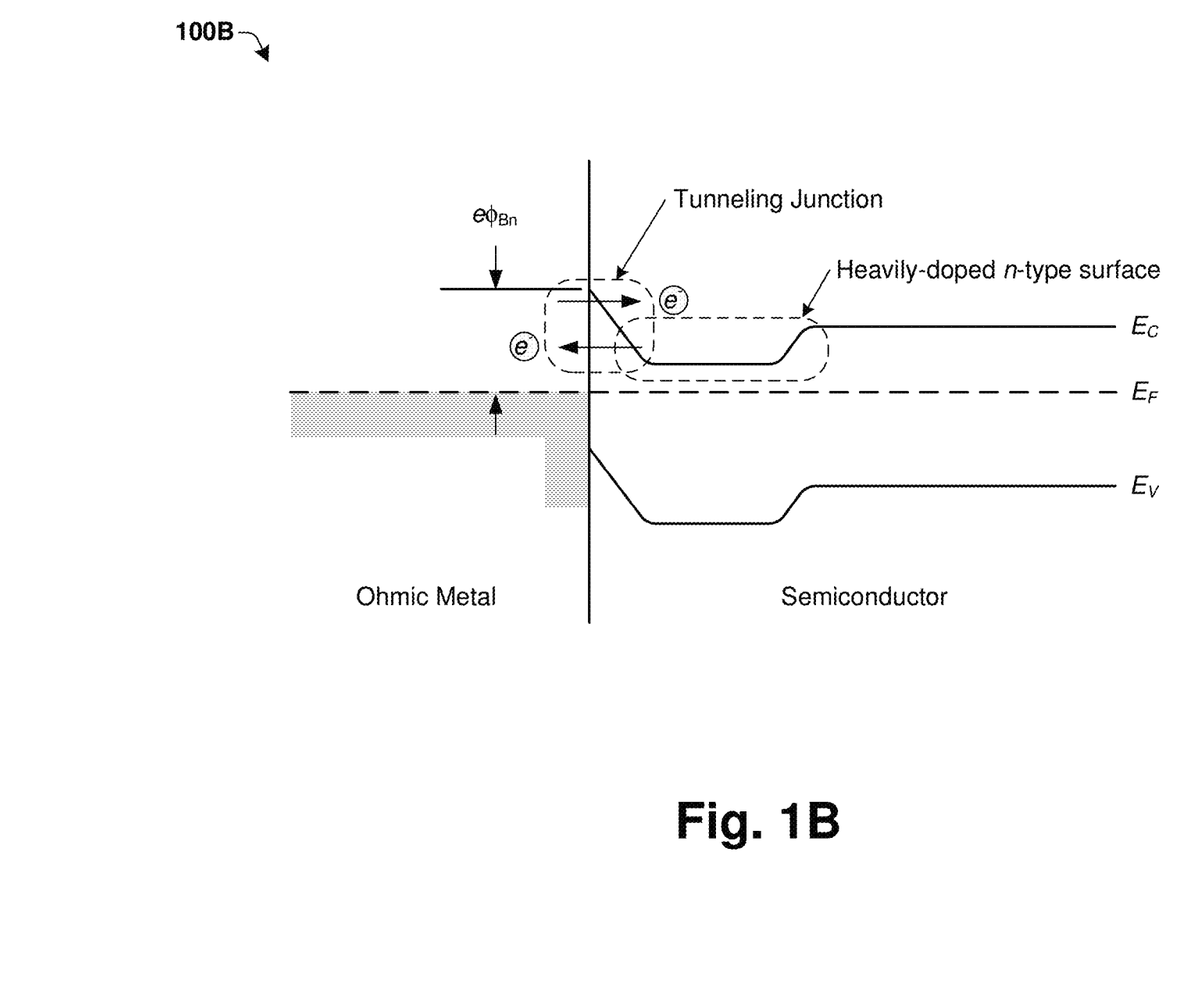
FIG. 1B illustrates an electron band structure of a heterojunction formed between an ohmic metal and a donor layer of $Al_xGa_{(1-x)}N$.

FIG. 1A illustrates a cross-sectional view of a transistor 100A comprising a donor layer 108A of $Al_xGa_{(1-x)}N$ formed beneath a source contact 102A, a gate 104A, and a drain contact 106A. A heterojunction 110A is formed between the donor layer 108A and a channel layer 112A of GaN. Electrons generated from the donor layer 108A diffuse into the GaN channel layer 112A to form a high-mobility/high-concentration two-dimensional electron gas (2DEG) 114A, which forms a channel of the device within the channel layer 112A in a vicinity of the heterojunction 110A. A thermal expansion layer 116A of $Al_yGa_{(1-y)}N$ is disposed beneath the donor layer of bi-layer AlGaN comprises a mobility-enhancing layer of $Al_zGa_{(1-z)}N$, and a resistance-reducing layer of $Al_xGa_{(1-x)}N$ disposed over the mobility-enhancing layer, wherein the ohmic source and drain contacts connect to the HEMT. A channel layer is disposed beneath the mobility-enhancing layer, wherein a 2 DEG resides, forming the channel of the HEMT.

Figure 2A:
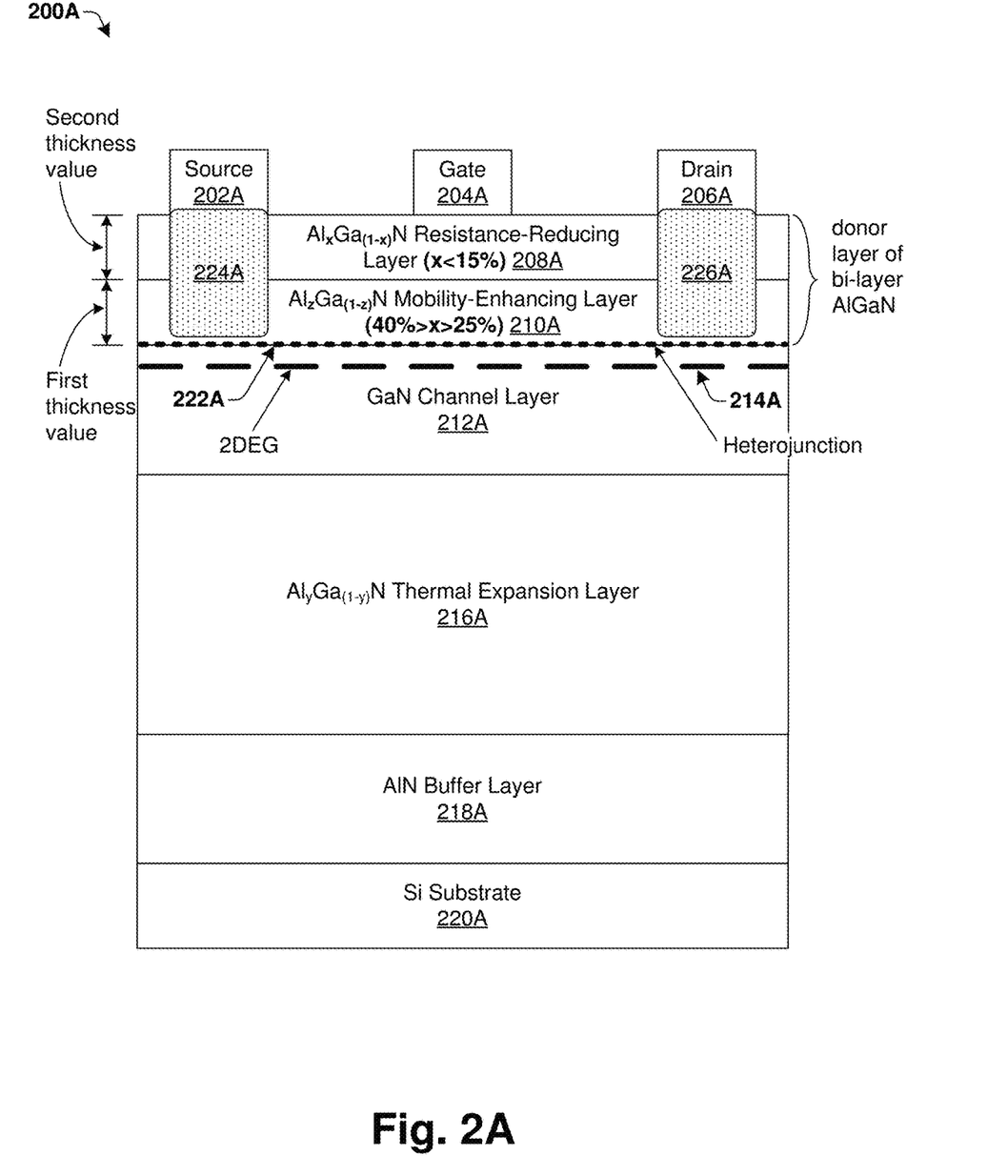
FIG. 2A illustrates a cross-sectional view of some embodiments of a transistor comprising a donor layer of bi-layer AlGaN further comprising a mobility-enhancing layer of $Al_zGa_{(1-z)}N$, and a resistance-reducing layer of $Al_xGa_{(1-x)}N$.

FIG. 2A illustrates a cross-sectional view of some embodiments of a transistor 200A comprising a donor layer of bi-layer AlGaN further comprising a mobility-enhancing layer 210A of $Al_zGa_{(1-z)}N$, wherein a third molar fraction z is less than approximately 0.4 and greater than approximately 0.25, and a resistance-reducing layer 208A of $Al_xGa_{(1-x)}N$ disposed over the mobility-enhancing layer 210A, wherein a first molar fraction x is less than approximately 0.15 and greater than approximately 0.1. The a donor layer of bi-layer AlGaN is formed beneath a source ohmic metal contact 202A connecting to the resistance-reducing layer 208A disposed over a source region 224A, a gate material 204A disposed above a channel region and connecting to the resistance-reducing layer 208A, and a drain ohmic metal contact 206A connecting to the resistance-reducing layer 208A disposed over a drain region 226A. In some embodiments, the source ohmic metal contact 202A and drain ohmic metal contact 206A comprise Ti/Al/Ti or Ti/Al/Ti/TiN, and the gate material 204A comprises TiN or WN. A heterojunction 222A is formed between the donor layer of bi-layer AlGaN and a channel layer 212A of GaN, wherein a 2 DEG 214A resides, comprising a high-mobility channel of the transistor 200A.

The transistor 200A further comprises a HEMT, wherein the mobility-enhancing layer 210A comprises a first thickness value that is approximately twice a second thickness value of the resistance-reducing layer 208A. In some embodiments, the first thickness value is between approximately 20 nanometers and 40 nanometers, and the second thickness value is between approximately 10 nanometers and 20 nanometers. A thermal expansion layer 216A of $Al_yGa_{(1-y)}N$ is disposed beneath the channel layer 212A, wherein a second molar fraction y is less than approximately 1 and greater than approximately 0. A buffer layer 218A of AN is disposed beneath the thermal expansion layer 216A, and above a Si substrate 220A.

Figure 2B:
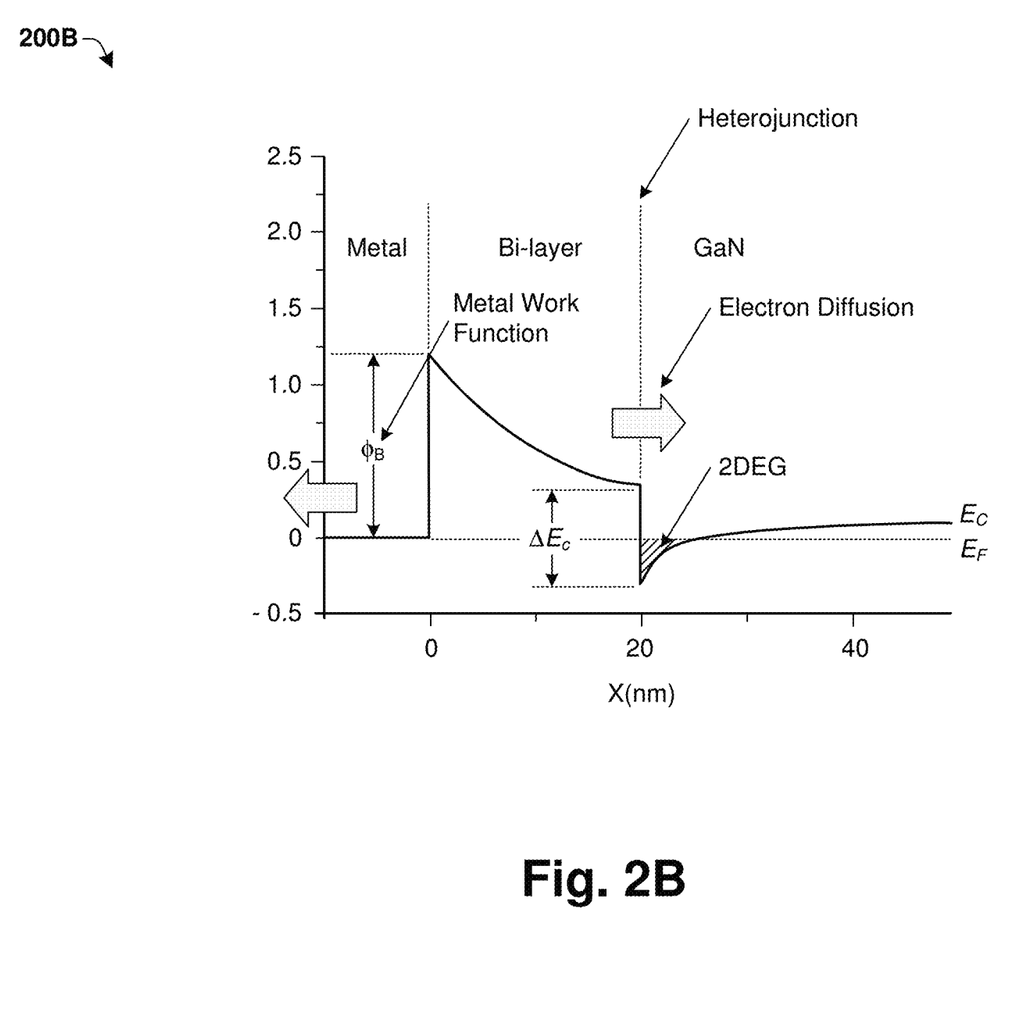
FIG. 2B illustrates some embodiments of an electron band structure of a heterojunction formed between a donor layer of bi-layer AlGaN and a channel layer of GaN.

FIG. 2B illustrates some embodiments of an electron band structure 200B of a heterojunction formed between the donor layer of bi-layer AlGaN of FIG. 2A and the channel layer 212A of GaN of FIG. 2A. Within the donor layer of bi-layer AlGaN, a concentration gradient between the mobility-enhancing layer of $Al_zGa_{(1-z)}N$ (0.4>z>0.25) and the resistance-reducing layer of $Al_xGa_{(1-x)}N$ (0.15>x>0.1) produces a conduction band ($E_C$) characteristic, wherein the energy of the conduction band decreases away from the ohmic metal and towards the channel layer of GaN. As a result, conduction electrons within the donor layer of bi-layer AlGaN diffuse into the channel layer 212A of GaN due to the conduction band ($E_C$) characteristic (e.g., electrons move to the lowest energy state). The electrons accumulate at a potential minimum of the conduction band ($E_C$), which dips below the Fermi level ($E_F$) at the heterojunction, trapping the electrons to form the 2 DEG.

Figure 3A:
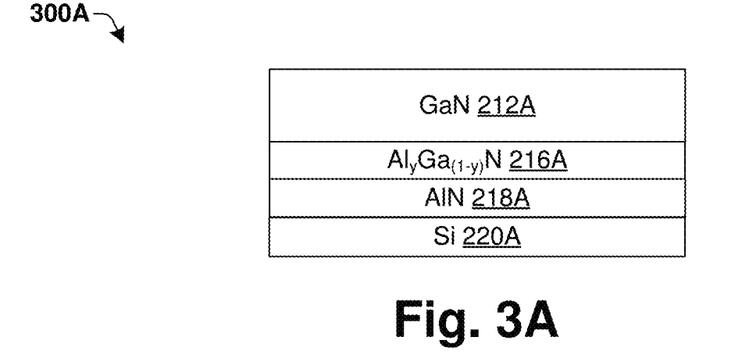
FIGS. 3A-3O illustrate cross-sectional views of some embodiments of a donor layer of bi-layer AlGaN fabrication within a transistor.
Figure 3B:
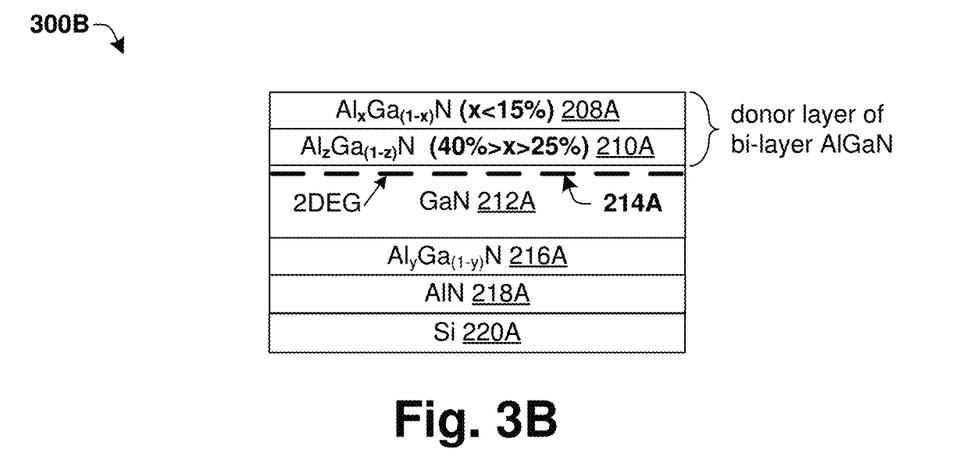
Figure 3C:
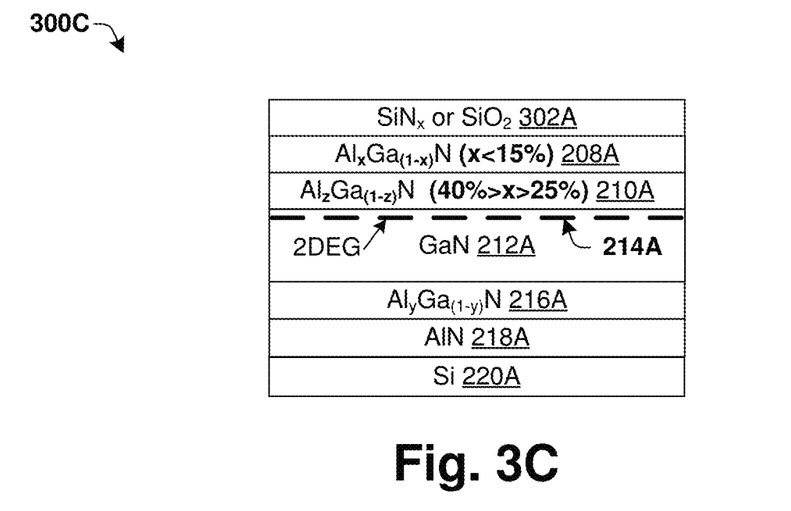
Figure 3D:
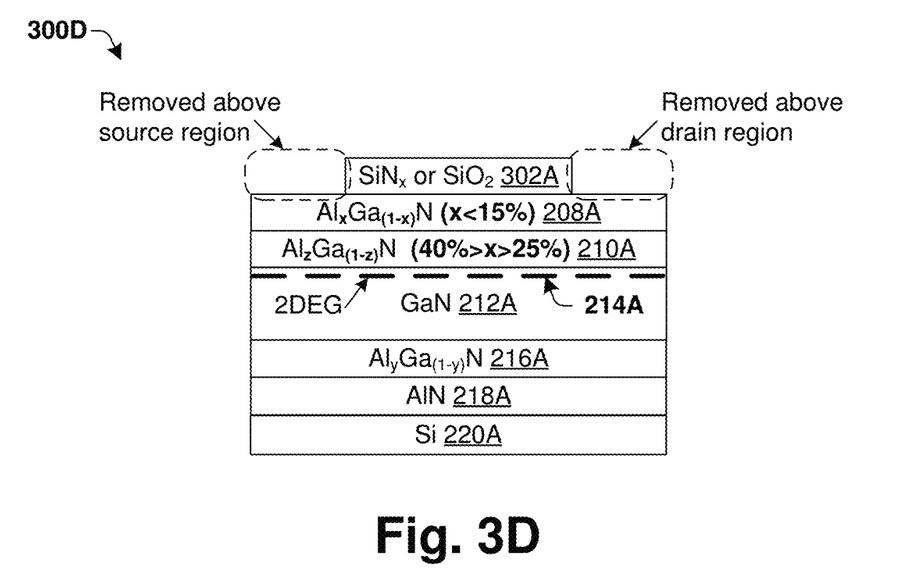
Figure 3E:
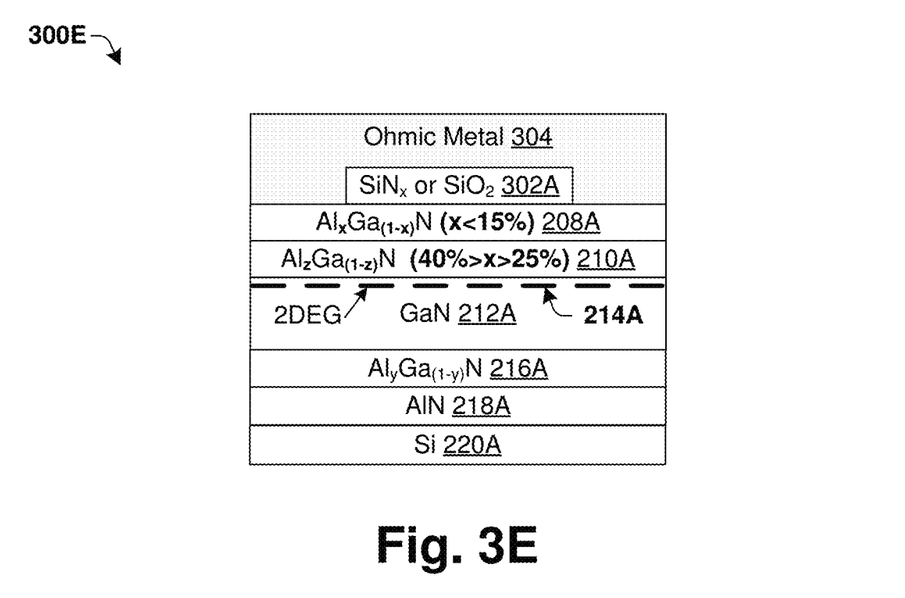
Figure 3F:
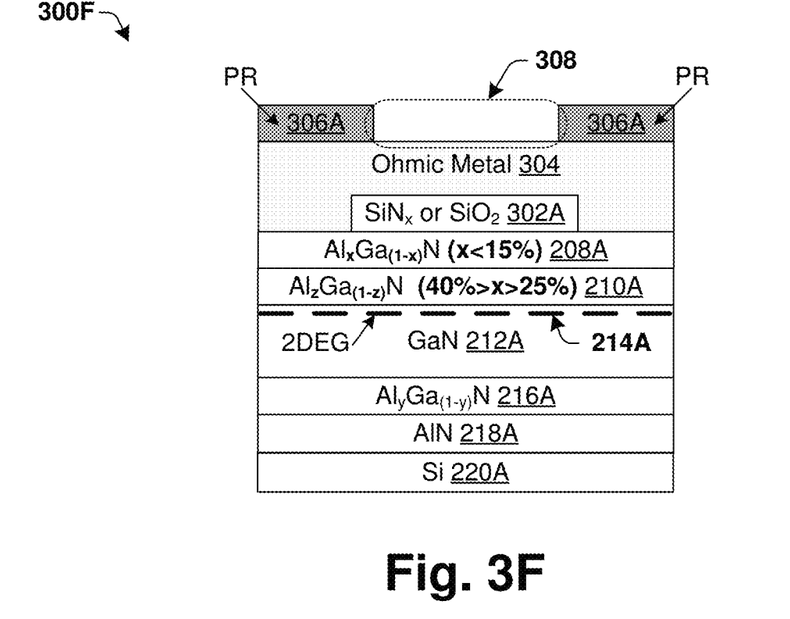
Figure 3G:
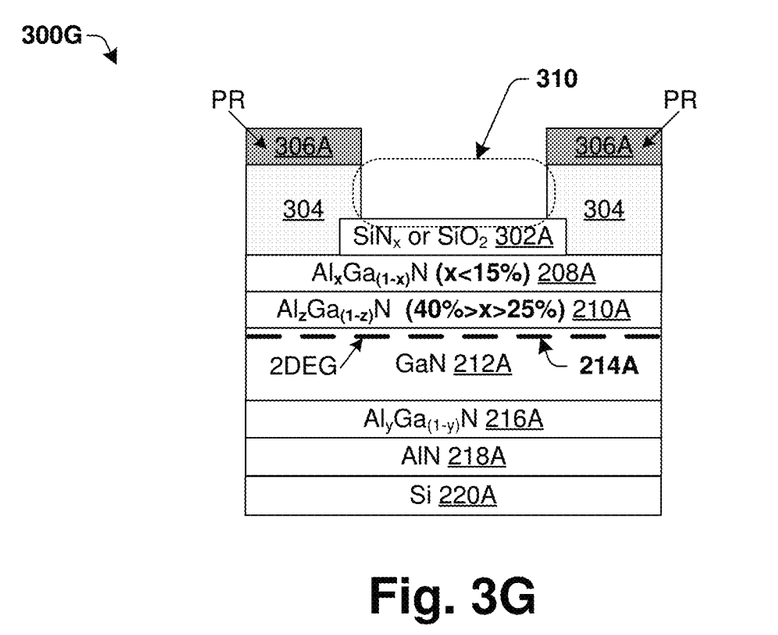
Figure 3H:
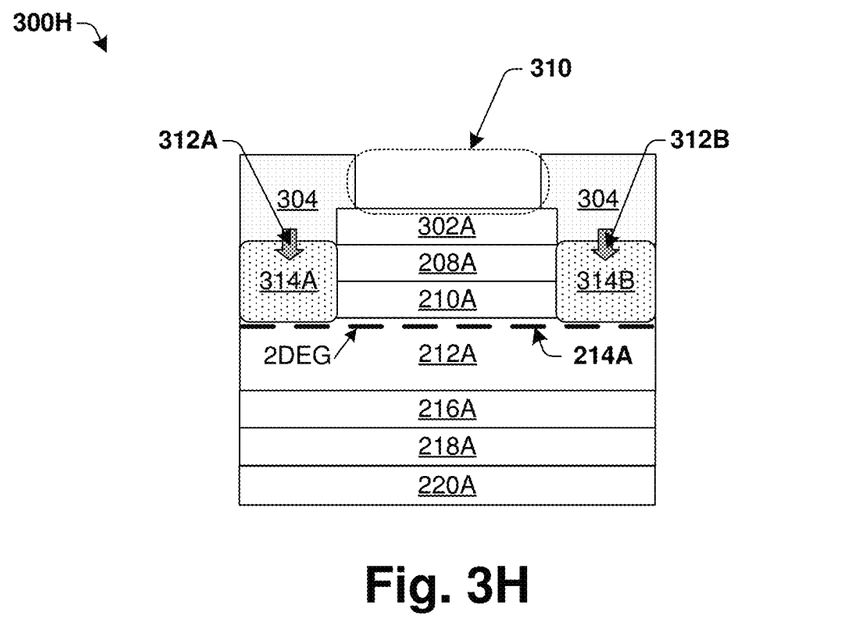
Figure 3I:
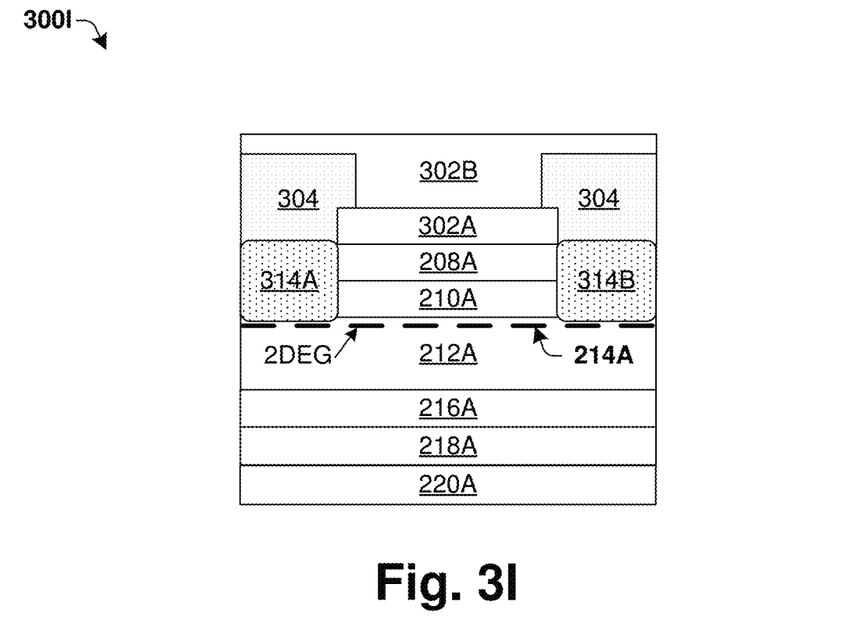
Figure 3J:
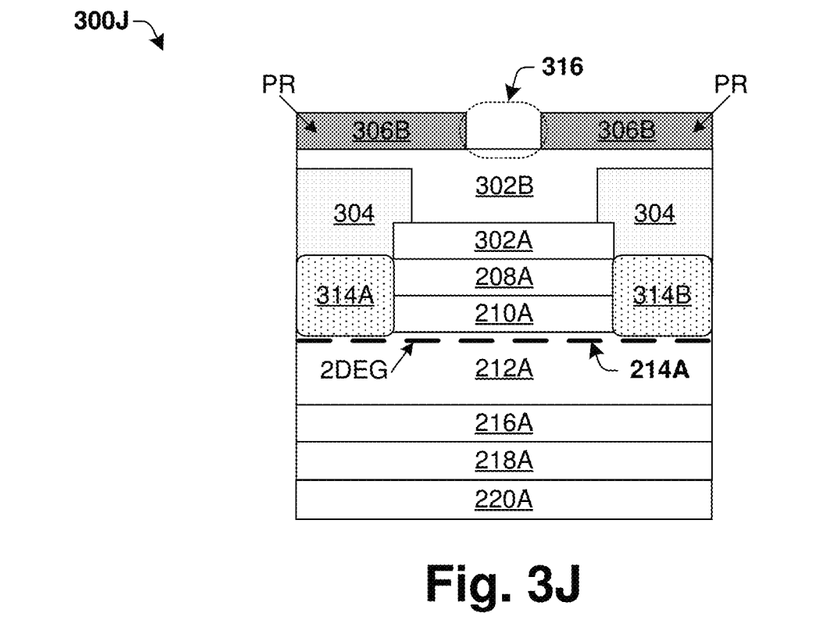
Figure 3K:
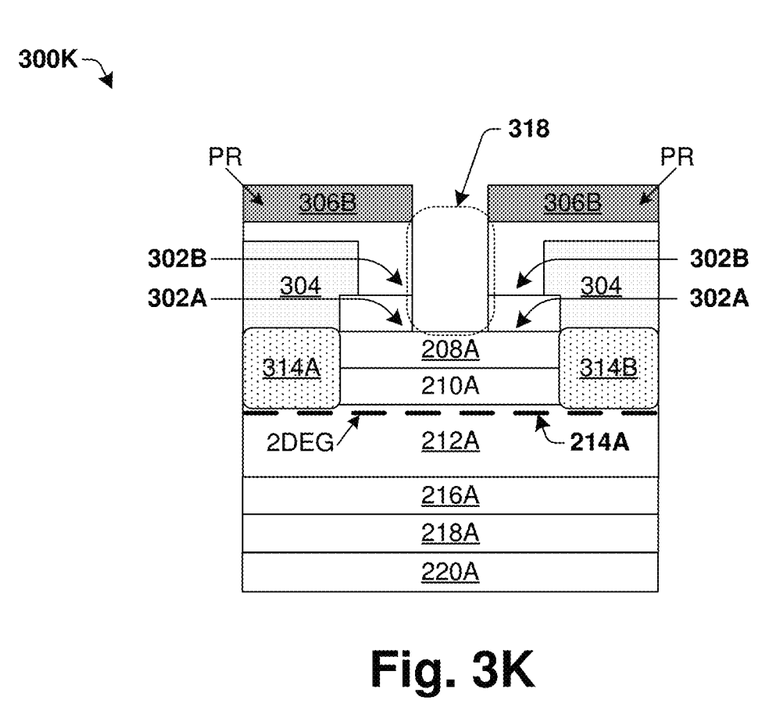
Figure 3L:
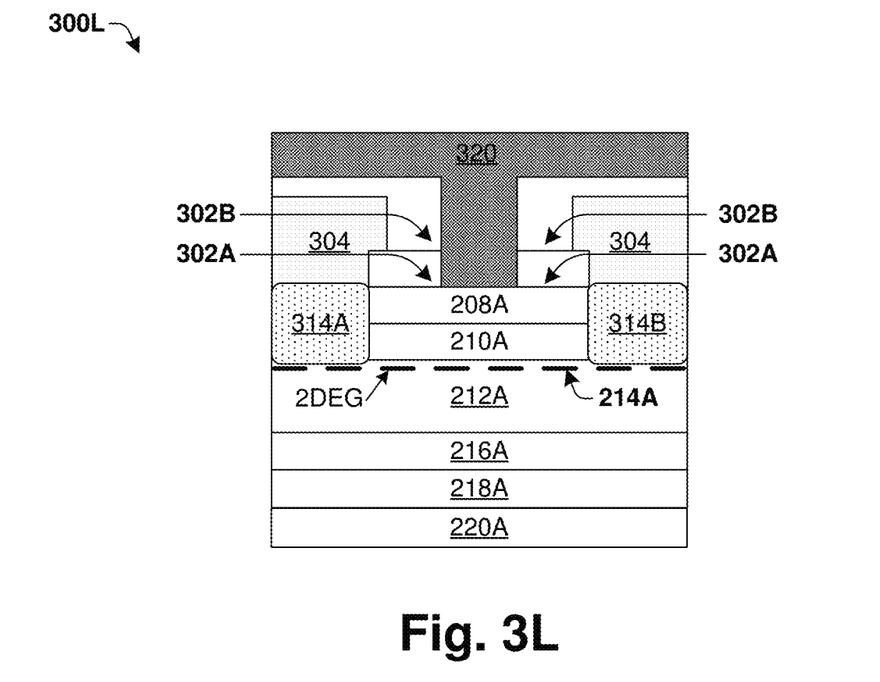
Figure 3M:
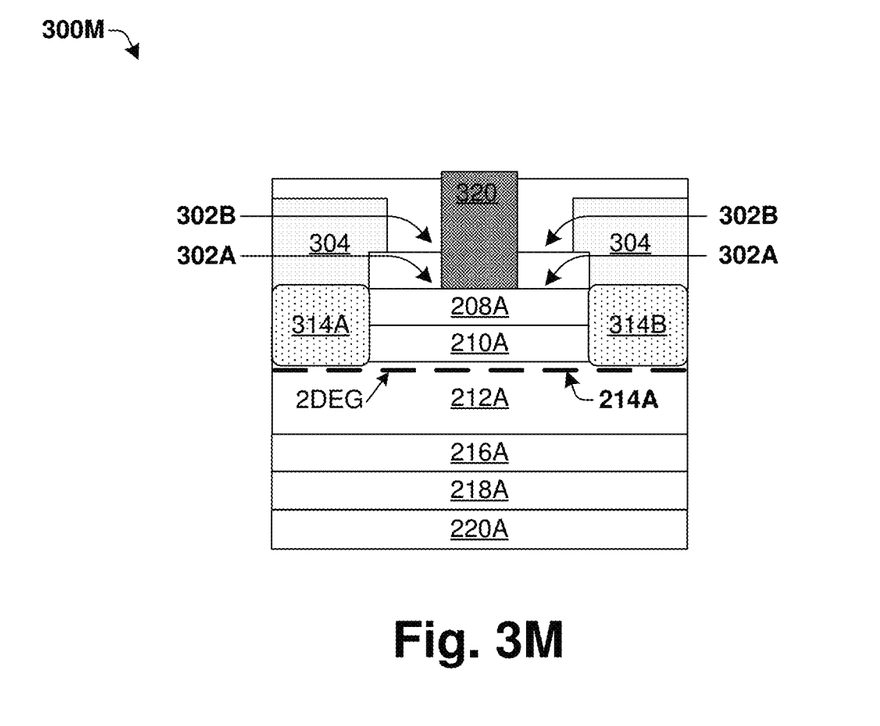
Figure 3N:
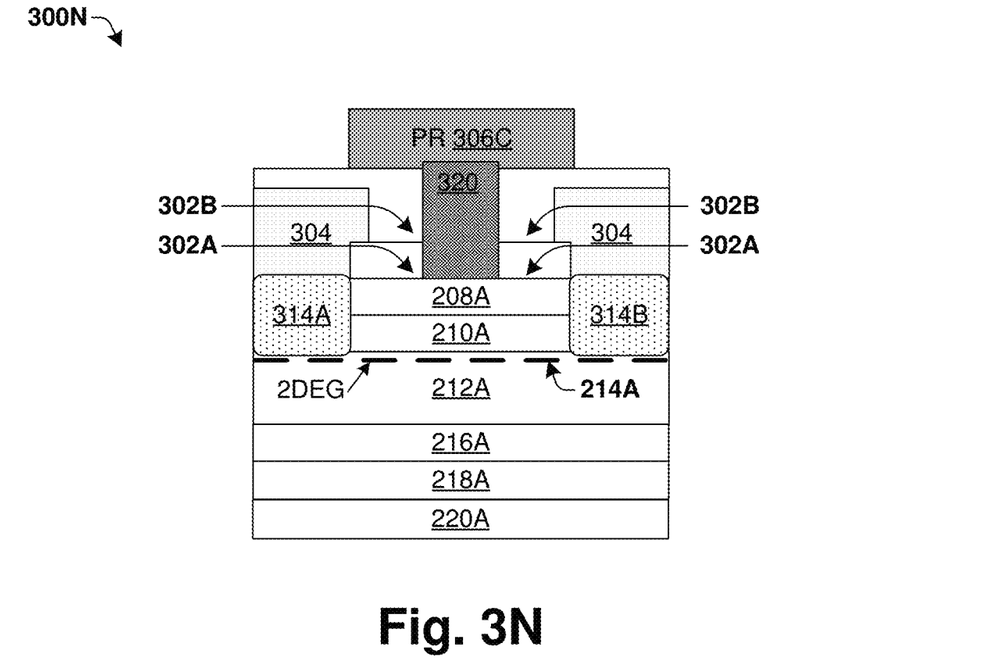
Figure 3O:
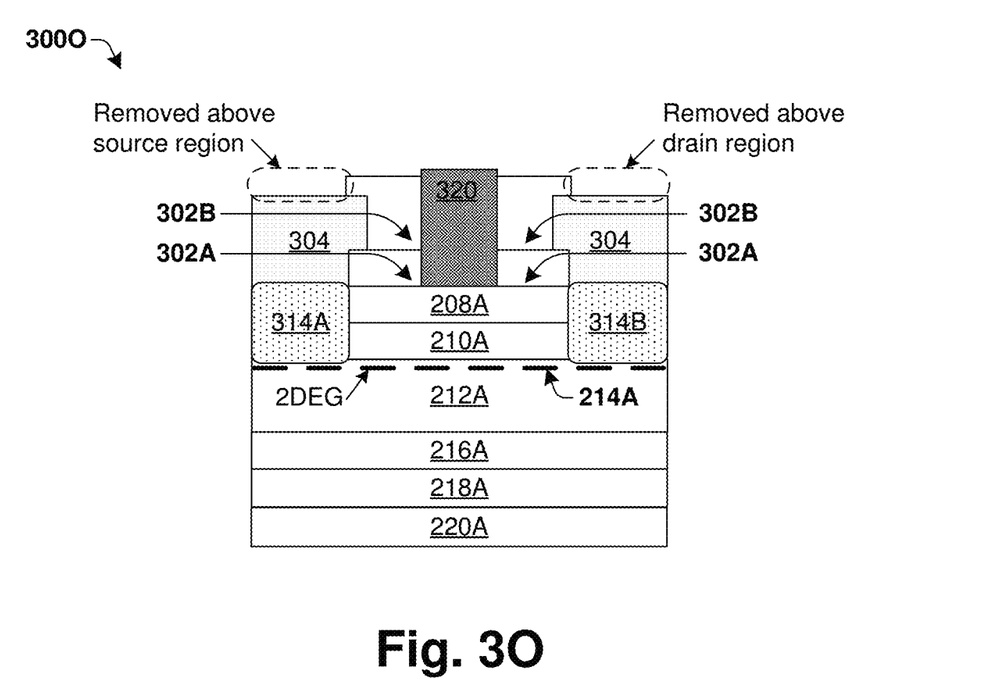

FIGS. 3A-3O illustrate cross-sectional views of some embodiments of a donor layer of bi-layer AlGaN fabrication within a transistor. FIG. 3A illustrates a semiconductor workpiece 300A comprising a Si substrate 220A, a buffer layer 218A of AN configured to lattice match the Si substrate 220A, a thermal expansion layer 216A of $Al_yGa_{(1-y)}N$ configured with a low coefficient of thermal expansion to achieve structural stability across a range of temperatures, and a channel layer 212A of GaN configured to shield the aforementioned layers from damage due to biasing of a gate (not yet shown). FIG. 3B illustrates a semiconductor workpiece 300B comprising the semiconductor workpiece 300A of FIG. 3A, wherein a donor layer of bi-layer AlGaN has been added. The donor layer of bi-layer AlGaN comprises a mobility-enhancing layer 210A of $Al_zGa_{(1-z)}N$ disposed over the channel layer 212A, wherein a third molar fraction z is less than approximately 0.4 and greater than approximately 0.25, and a resistance-reducing layer 208A of $Al_xGa_{(1-x)}N$ disposed over the mobility-enhancing layer 210A, wherein a first molar fraction x is less than approximately 0.15 and greater than approximately 0.1. FIG. 3C illustrates a semiconductor workpiece 300C comprising the semiconductor workpiece 300B of FIG. 3B, wherein a first isolation layer 302A has been added above the resistance-reducing layer 208A. The first isolation layer 302A comprises $SiN_x$ or $SiO_2$, wherein x is the first molar fraction. FIG. 3D illustrates a semiconductor workpiece 300D comprising the semiconductor workpiece 300C of FIG. 3C, wherein portions of the first isolation layer 302A have been removed above a source region and a drain region. FIG. 3E illustrates a semiconductor workpiece 300E comprising the semiconductor workpiece 300D of FIG. 3D, wherein an ohmic metallization layer 304 has been added above the first isolation layer 302A, source region, and drain region.

FIG. 3F illustrates a semiconductor workpiece 300F comprising the semiconductor workpiece 300E of FIG. 3E, wherein a first layer of photoresist 306A has been disposed above the ohmic metallization layer 304, exposed, and developed through optical lithography to create an first opening 308 in the first layer of photoresist 306A. FIG. 3G illustrates a semiconductor workpiece 300G comprising the semiconductor workpiece 300F of FIG. 3F, wherein the ohmic metallization layer 304 has been etched away beneath the first opening 308 to create a first recess 310 within the ohmic metallization layer 304. FIG. 3H illustrates a semiconductor workpiece 300H comprising the semiconductor workpiece 300G of FIG. 3G, wherein electrons tunnel from the ohmic metallization layer 304 into the $Al_xGa_{(1-x)}N/Al_zGa_{(1-z)}N$ donor bi-layer through a source tunneling junction 312A between the ohmic metallization layer 304 and a source region 314A, and a drain tunneling junction 312B between the ohmic metallization layer 304 and a drain region 314B. Electrons within the $Al_xGa_{(1-x)}N/Al_zGa_{(1-z)}N$ donor bi-layer also diffuse into the channel layer 212A, and accumulate to form the 2 DEG 214A. FIG. 3I illustrates a semiconductor workpiece 300I comprising the semiconductor workpiece 300H of FIG. 3H, wherein a second isolation layer 302B been added above the first isolation layer 302A and the ohmic metallization layer 304. The second isolation layer 302B also comprises $SiN_X$ or $SiO_2$, wherein x is the first molar fraction.

FIG. 3J illustrates a semiconductor workpiece 300J comprising the semiconductor workpiece 300I of FIG. 3I, wherein a second layer of photoresist 306B has been disposed above the second isolation layer 302B, exposed, and developed through optical lithography to create an second opening 316 in the second layer of photoresist 306B. FIG. 3K illustrates a semiconductor workpiece 300K comprising the semiconductor workpiece 300J of FIG. 3J, wherein portions of the second isolation layer 302B and the first isolation layer 302A have been etched away beneath the second opening 316 to create a second recess 318 over the channel region. FIG. 3L illustrates a semiconductor workpiece 300L comprising the semiconductor workpiece 300K of FIG. 3K, wherein the second recess 318 has been filled with a gate material 320 which extends over a surface of the second isolation layer 302B. FIG. 3M illustrates a semiconductor workpiece 300M comprising the semiconductor workpiece 300L of FIG. 3L, wherein the gate material 320 over the surface of the second isolation layer 302B has been removed.

FIG. 3N illustrates a semiconductor workpiece 300N comprising the semiconductor workpiece 300M of FIG. 3M, wherein a third layer of photoresist 306C has been disposed, exposed, and developed through optical lithography to remove the third layer of photoresist 306C above the source region 314A and a drain region 314B. FIG. 3O illustrates a semiconductor workpiece 300O comprising the semiconductor workpiece 300N of FIG. 3N, wherein portions of the second isolation layer 302B have been etched away above the source region 314A and a drain region 314B to allow for a contact to the source region 314A and a drain region 314B through the ohmic metallization layer 304, resulting in a HEMT transistor.

Figure 4:
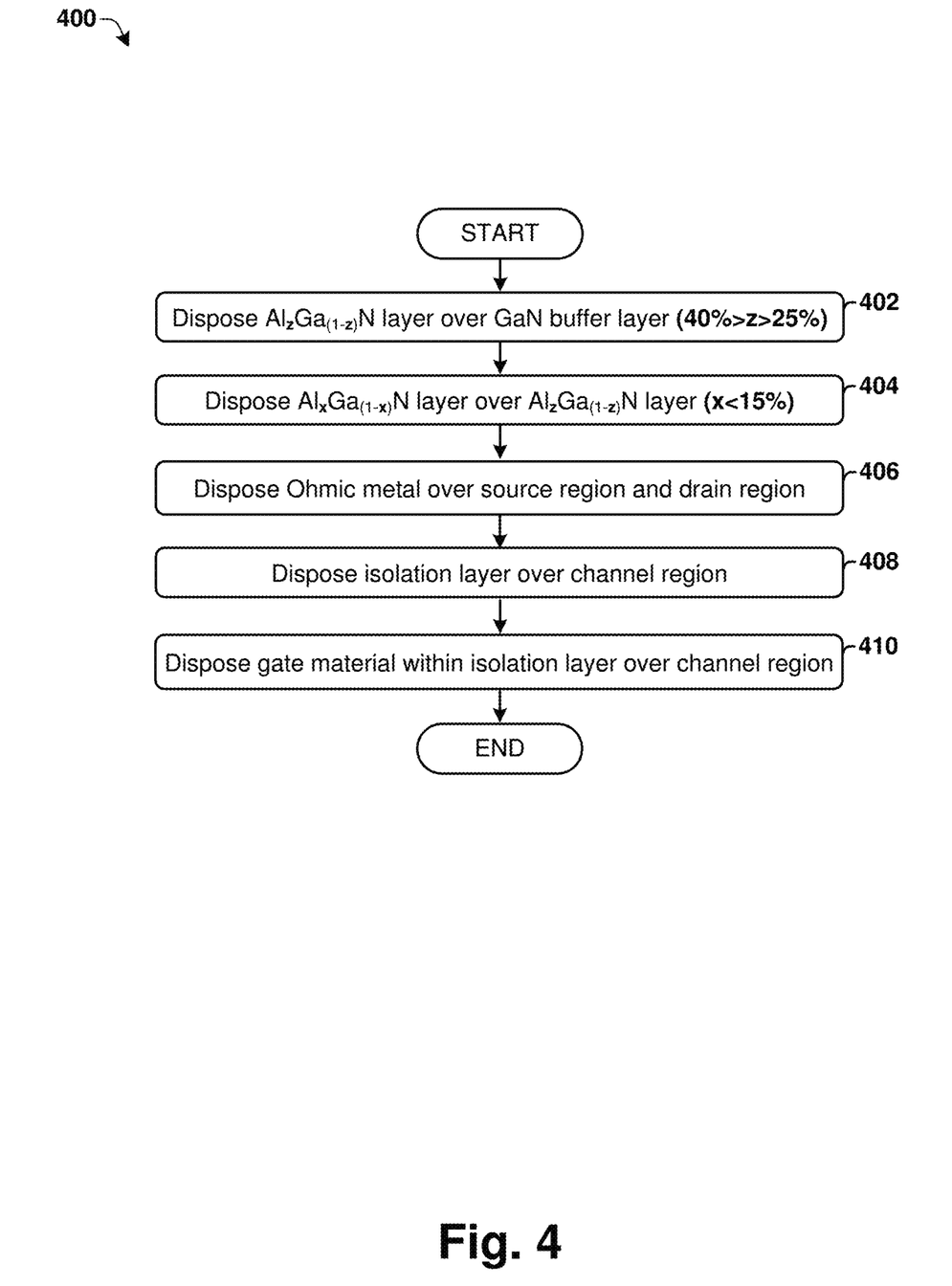
FIG. 4 illustrates some embodiments of a method to form a donor layer of bi-layer AlGaN.
Figure 5:
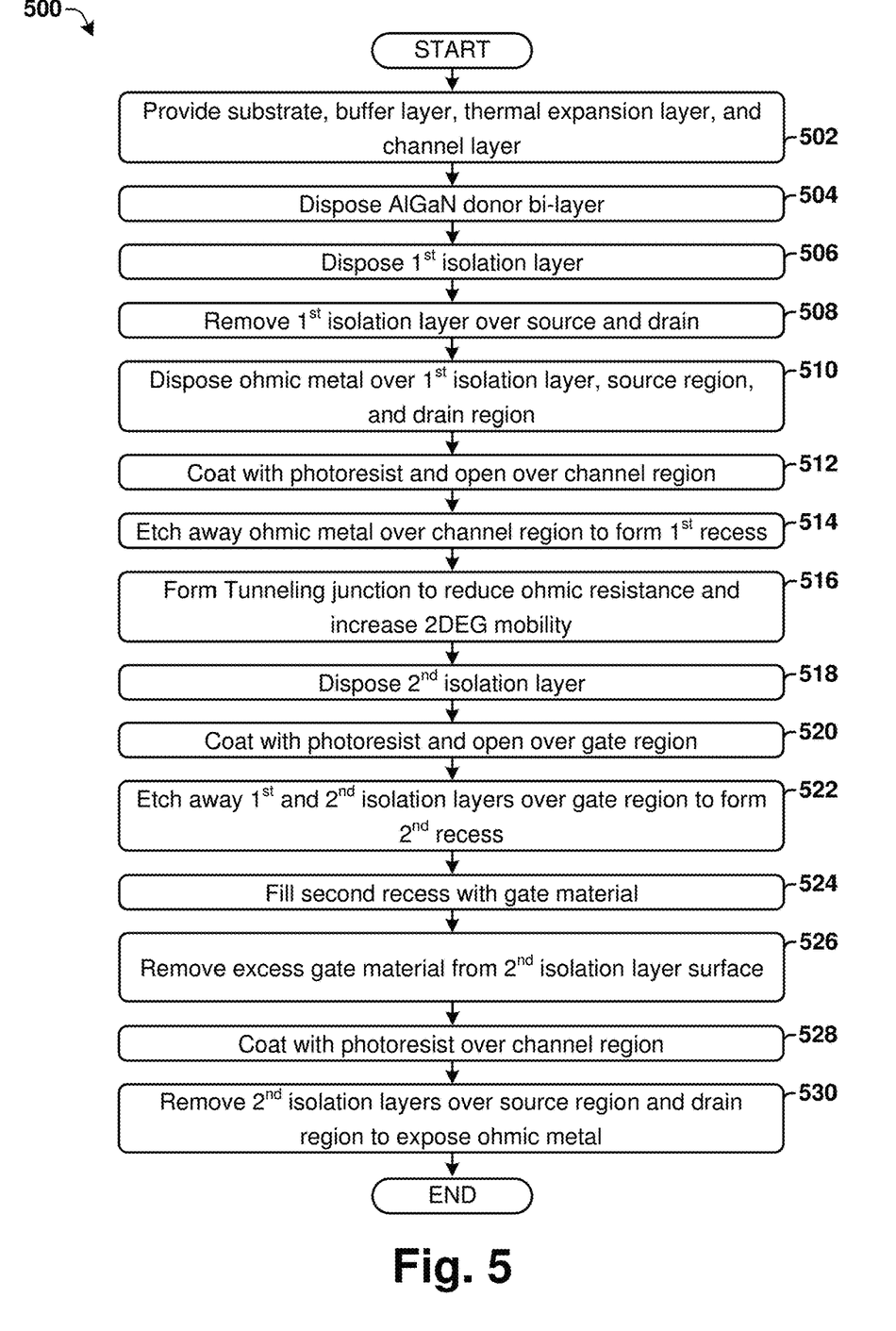
FIG. 5 illustrates some embodiments of a method to form a HEMT comprising a donor layer of bi-layer AlGaN.

FIGS. 4-5 illustrate some embodiments of methods 400 and 500 to form a donor layer of bi-layer AlGaN and a transistor comprising the donor layer of bi-layer AlGaN, respectively. While methods 400 and 500 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 4 illustrates some embodiments of a method 400 to form a donor layer of bi-layer AlGaN.

At 402, a mobility-enhancing layer of $Al_zGa_{(1-z)}N$ is disposed over a substrate, wherein a third molar fraction z is less than approximately 0.4 and greater than approximately 0.25. In some embodiments, disposal of the mobility-enhancing layer comprises metal organic chemical vapor deposition (MOCVD) or molecular beam epitaxy (MBE).

At 404, a resistance-reducing layer of $Al_xGa_{(1-x)}N$ is disposed over the mobility-enhancing layer, wherein a first molar fraction x is less than approximately 0.15 and greater than approximately 0.1. In some embodiments, disposal of the resistance-reducing layer comprises MOCVD or MBE.

At 406, a source ohmic contact is disposed to connect to the resistance-reducing layer over a source region and a drain ohmic contact is disposed to connect to the resistance-reducing layer over a drain region. In some embodiments, disposal of the source ohmic metal contact and the drain ohmic metal contact comprises sputtering, a thermal coating technique, or electron-bean (e-beam) evaporation of Ti/Al/

Ti or Ti/Al/Ti/TiN. A source tunneling junction results at a first interface between the resistance-reducing and the source ohmic metal contact and a drain tunneling junction results at a second interface between the resistance-reducing and the drain ohmic metal contact.

At 408, an isolation layer is disposed over the resistance-reducing layer over a channel region residing between the source region and the drain region. In some embodiments, disposal of the isolation layer comprises low pressure chemical vapor deposition (LPCVD) or plasma enhanced chemical vapor deposition (PECVD).

At 410, a gate material is disposed within the isolation layer over the channel region and contacting the resistance-reducing layer. In some embodiments the gate material comprises TiN or WN. In some embodiments the gate material is disposed with a gate-first or metal inserted poly-silicon (MIPS) fabrication process. In some embodiments the gate material is disposed with a gate-last, or replacement metal gate (RMG) fabrication process.

FIG. 5 illustrates some embodiments of a method 500 to form a HEMT comprising a donor layer of bi-layer AlGaN. Note that the method 500 follows the fabrication flow illustrated in the embodiments of FIGS. 3A-3O.

At 502, a semiconductor workpiece is provided, the semiconductor workpiece comprising a Si substrate, a buffer layer of AN configured to lattice match the Si substrate, a thermal expansion layer of $Al_yGa_{(1-y)}N$ configured with a low coefficient of thermal expansion to achieve structural stability across a range of temperatures, and a channel layer of GaN configured to shield the aforementioned layers from damage due to biasing of a gate. Layers of the semiconductor workpiece are disposed on the Si substrate through MOCVD or MBE.

At 504, a donor layer of bi-layer AlGaN is disposed on the semiconductor workpiece through MOCVD or MBE. The donor layer of bi-layer AlGaN comprises a mobility-enhancing layer of $Al_zGa_{(1-z)}N$ disposed over the channel layer, wherein a third molar fraction z is less than approximately 0.4 and greater than approximately 0.25, and a resistance-reducing layer of $Al_xGa_{(1-x)}N$ disposed over the mobility-enhancing layer, wherein a first molar fraction x is less than approximately 0.15 and greater than approximately 0.1.

At 506, a first isolation layer comprising $SiN_X$ or $SiO_2$, wherein x is the first molar fraction, is disposed above the resistance-reducing layer through LPVCD or PECVD.

At 508, portions of the first isolation layer are removed above a source region and a drain region through a photomask patterning process comprising optical lithography and subsequent etch step (e.g., a wet etch, dry etch, chemical etch, plasma etch, a combination thereof, etc.).

At 510, an ohmic metallization layer is disposed above the first isolation layer, source region, and drain region through sputtering, a thermal coating technique, an e-beam evaporator, etc.

At 512, a first layer of photoresist is disposed above the ohmic metallization layer through a spin-coating technique. The first layer of photoresist is exposed and developed through optical lithography to create a first opening the first layer of photoresist above a channel region of the HEMT At 514, the ohmic metallization layer is etched away beneath the first opening to create a first recess within the ohmic metallization layer. In some embodiments, etching of the ohmic metallization layer comprises a dry etch.

At 516, electrons tunnel from the ohmic metallization layer into the donor layer of bi-layer AlGaN through a source/drain tunneling junctions 312A between the ohmic metallization layer and a source/drain regions. Electrons within the donor layer of bi-layer AlGaN also diffuse into the channel layer, and accumulate to form the 2 DEG which acts as the channel of the HEMT.

At 518, a second isolation layer is disposed above the first isolation layer and the ohmic metallization layer. The second isolation layer also comprises $SiN_X$ or $SiO_2$, wherein x is the first molar fraction, and is disposed through LPVCD or PECVD.

At 520, a second layer of photoresist is spin-coated above the second isolation layer, and exposed and developed through optical lithography to create an second opening in the second layer of photoresist.

At 522, portions of the second isolation layer and the first isolation layer are etched away beneath the second opening to create a second recess over the channel region of the HEMT.

At 524, the second recess is been filled with a gate material which extends over a surface of the second isolation layer. In some embodiments the gate material is disposed with a metal inserted poly-silicon (MIPS) fabrication process. In some embodiments the gate material is disposed with a replacement metal gate (RMG) fabrication process.

At 526, excess gate material is removed over the surface of the second isolation layer through a chemical-mechanical polish (CMP) or a photomask patterning process comprising optical lithography and subsequent etch step (e.g., a wet etch, dry etch, chemical etch, plasma etch, a combination thereof, etc.).

At 528, a third layer of photoresist is spin-coated above the HEMT, patterned, exposed, and developed through optical lithography to remove the third layer of photoresist above the source/drain regions of the HEMT.

At 530, the portions of the second isolation layer are etched away above the source/drain regions to allow for a contact to the source/drain regions through the ohmic metallization layer, resulting in the HEMT transistor 200A of FIG. 2A.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a transistor device having a donor bi-layer configured to provide low-resistance to source and drain contacts while maintaining a high-mobility two-dimensional electron gas within a channel layer, and an associated method of formation.

In some embodiments, the present disclosure relates to a transistor device. The transistor device comprises a channel layer disposed over a substrate and a donor bi-layer disposed over the channel layer. The donor bi-layer comprises a mobility-enhancing layer of $Al_zGa_{(1-z)}N$ disposed over the channel layer and having a first molar fraction z in a first range, and a resistance-reducing layer of $Al_xGa_{(1-x)}N$ disposed on and in contact with the mobility-enhancing layer of $Al_zGa_{(1-z)}N$ and having a second molar fraction x in a second range less than the first range. A source contact and a drain contact are over the resistance-reducing layer of $Al_xGa_{(1-x)}N$. The donor bi-layer has a conduction band energy that monotonically decreases from a top surface of the donor bi-layer to a bottom surface of the donor bi-layer.

In other embodiments, the present disclosure relates a transistor device. The transistor device comprises a layer of gallium nitride (GaN) disposed over a substrate, a mobility-enhancing layer of $Al_zGa_{(1-z)}N$ disposed over the layer of GaN and having a first molar fraction z in a first range, and a resistance-reducing layer of $Al_xGa_{(1-x)}N$ disposed on and in contact with the mobility-enhancing layer of $Al_zGa_{(1-z)}N$ and having a second molar fraction x in a second range less than the first range. A conduction band energy comprises a non-piecewise function extending between a top surface of the resistance-reducing layer of $Al_xGa_{(1-x)}N$ and a bottom surface of the mobility-enhancing layer of $Al_zGa_{(1-z)}N$.

In yet other embodiments, the present disclosure relates to a method of forming a transistor device. The method comprises forming a channel layer over a substrate, and forming a mobility-enhancing layer of $Al_zGa_{(1-z)}N$ on the channel layer using a first single deposition process. The mobility-enhancing layer of $Al_zGa_{(1-z)}N$ has a first molar fraction z in a first range. The method further comprises forming a resistance-reducing layer of $Al_xGa_{(1-x)}N$ on and in contact with the mobility-enhancing layer of $Al_zGa_{(1-z)}N$ using a second single deposition process. The resistance-reducing layer of $Al_xGa_{(1-x)}N$ has a second molar fraction x in a second range less than the first range. The method further comprises forming a source contact and a drain contact onto the resistance-reducing layer of $Al_xGa_{(1-x)}N$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device, comprising:
   a layer of GaN disposed over a substrate;
   a mobility-enhancing layer of $Al_zGa_{(1-z)}N$ disposed over the layer of GaN and having a first molar fraction z that is in a first range of between 0.25 and 0.4;
   a resistance-reducing layer of $Al_xGa_{(1-x)}N$ disposed over the mobility-enhancing layer of $Al_zGa_{(1-z)}N$ and having a second molar fraction x that in a second range of between 0.1 and 0.15;
   a source comprising a source contact and an underlying source region, wherein the source region extends through the resistance-reducing layer of $Al_xGa_{(1-x)}N$ and into the mobility-enhancing layer of $Al_zGa_{(1-z)}N$, and wherein the source region has a bottom that is over a bottom of the mobility-enhancing layer of $Al_zGa_{(1-z)}N$;
   a drain comprising a drain contact and an underlying drain region, wherein the drain region extends through the resistance-reducing layer of $Al_xGa_{(1-x)}N$ and into the mobility-enhancing layer of $Al_zGa_{(1-z)}N$, and wherein the drain region has a bottom that is over the bottom of the mobility-enhancing layer of $Al_zGa_{(1-z)}N$;
   a first isolation structure arranged over the resistance-reducing layer of $Al_xGa_{(1-x)}N$, wherein the source region and the drain region each have a top surface that is above a bottom surface of the first isolation structure;
   a second isolation structure arranged over the first isolation structure;
   a gate structure laterally between the source contact and the drain contact, wherein the gate structure has a sidewall defined by a differentiable function between a top and a bottom of the sidewall, and wherein the sidewall extends between a top of the second isolation structure and a bottom of the first isolation structure; and
   wherein the drain contact has a first sidewall and a second sidewall laterally offset from the first sidewall, and wherein the first sidewall is disposed along a sidewall of the second isolation structure and the second sidewall is disposed along a sidewall of the first isolation structure.

2. The transistor device of claim 1, wherein the bottom of the source region is below a top surface of the mobility-enhancing layer of $Al_zGa_{(1-z)}N$.

3. The transistor device of claim 1, wherein the first range of the first molar fraction z is configured to provide the resistance-reducing layer of $Al_xGa_{(1-x)}N$ with a lower contact resistance than that of the mobility-enhancing layer of $Al_zGa_{(1-z)}N$.

4. The transistor device of claim 1, wherein the drain contact has a third sidewall opposite the first sidewall, wherein the third sidewall is defined by a differentiable function that extends between a top of the drain contact and a bottom of the drain contact.

5. The transistor device of claim 1,
   wherein the first sidewall faces the gate structure and the second sidewall faces the gate structure, and
   wherein the first sidewall is separated from the sidewall of the gate structure by a first distance and the second sidewall is separated from the sidewall of the gate structure by a second distance that is larger than the first distance.

6. The transistor device of claim 1, wherein the source region protrudes outward from a top surface of the resistance-reducing layer of $Al_xGa_{(1-x)}N$ by a non-zero distance.

7. A transistor device, comprising:
   a layer of GaN disposed over a substrate;
   a first layer of $Al_zGa_{(1-z)}N$ directly contacting the layer of GaN, and having a first molar fraction z in a first range and a first thickness;
   a second layer of $Al_xGa_{(1-x)}N$ disposed on and in contact with the first layer of $Al_zGa_{(1-z)}N$ and having a second molar fraction x in a second range less than the first range and a second thickness that is less than half of the first thickness, wherein a conduction band energy comprises a non-piecewise function extending between a top surface of the second layer of $Al_xGa_{(1-x)}N$ and a bottom surface of the first layer of $Al_zGa_{(1-z)}N$;
   a source contact and a drain contact over the second layer of $Al_xGa_{(1-x)}N$ and laterally surrounded by a first isolation structure and by a second isolation structure over the first isolation structure;
   a source region disposed below the source contact, wherein the source region has a topmost surface that is above a bottommost surface of the first isolation structure, the source region extending through the second layer of $Al_xGa_{(1-x)}N$ and into the first layer of $Al_zGa_{(1-z)}N$, and wherein the source region has a bottom that is over a bottom of the first layer of $Al_zGa_{(1-z)}N$;

a drain region disposed below the drain contact, wherein the drain region has a topmost surface that is above a bottommost surface of the first isolation structure, the drain region extending through the second layer of $Al_xGa_{(1-x)}N$ and into the first layer of $Al_zGa_{(1-z)}N$, and wherein the drain region has a bottom that is over a bottom of the first layer of $Al_zGa_{(1-z)}N$; and a gate structure over the second layer of $Al_xGa_{(1-x)}N$ between the source contact and the drain contact.

8. The transistor device of claim 7, wherein the bottommost surface of the first isolation structure and a bottommost surface of the gate structure contact an upper surface of the second layer of $Al_xGa_{(1-x)}$.

9. The transistor device of claim 8, wherein the source region extends from the topmost surface that protrudes outward past the top surface of the second layer of $Al_xGa_{(1-x)}N$ by a non-zero distance to above an interface between the layer of GaN and the first layer of $Al_zGa_{(1-z)}N$.

10. The transistor device of claim 7, wherein the source region is aligned with a first sidewall of the source contact and laterally offset from an opposing second sidewall of the source contact.

11. A transistor device, comprising:
a layer of gallium nitride disposed over a substrate;
a mobility-enhancing layer disposed over the layer of gallium nitride and comprising gallium aluminum nitride having a first molar percentage of aluminum;
a resistance-reducing layer disposed over the mobility-enhancing layer and comprising gallium aluminum nitride having a second molar percentage of aluminum that is smaller than the first molar percentage of aluminum;
a source comprising a source contact on a source region, the source region extending through the resistance-reducing layer and into the mobility-enhancing layer, and wherein the source region has a bottom that is over a bottom of the mobility-enhancing layer;
a drain comprising a drain contact on a drain region, the drain region extending through the resistance-reducing layer and into the mobility-enhancing layer, and wherein the drain region has a bottom that is over a bottom of the mobility-enhancing layer;
a gate structure directly between the source contact and the drain contact;
a first dielectric layer arranged over the resistance-reducing layer and laterally surrounding the gate structure, wherein the source region and the drain region each have a top surface that is above a bottom surface of the first dielectric layer; and
a second dielectric layer arranged over the first dielectric layer and laterally surrounding the gate structure.

12. The transistor device of claim 11, wherein a bottom surface of the source contact directly contacts the source region.

13. The transistor device of claim 11, wherein the source region protrudes outward from a top surface of the resistance-reducing layer.

14. The transistor device of claim 11, wherein the source contact and the drain contact are both above a top of the resistance-reducing layer.

15. The transistor device of claim 11, wherein the source region and the drain region are closer to the substrate than the gate structure.

16. The transistor device of claim 11, wherein the mobility-enhancing layer and the resistance-reducing layer have a conduction band energy with a slope that decreases as a distance from the substrate decreases.

17. The transistor device of claim 11, wherein the source contact comprises a first sidewall facing the gate structure and disposed along a first isolation structure, wherein the source contact further comprises a second sidewall facing the gate structure, and wherein the second sidewall is disposed along a second isolation structure and over the first isolation structure.

18. The transistor device of claim 17, wherein the source contact further comprises a third sidewall opposite the first sidewall that continuously extends along a vertical axis from a bottom of the source contact to a top of the source contact.

19. The transistor device of claim 11, wherein the source contact has a bottom surface that has a first width that is equal to a second width of the source region and a top surface that has a third width that is greater than the second width.

20. The transistor device of claim 11, wherein the first dielectric layer comprises a top surface that laterally extends past a sidewall of the second dielectric layer.

* * * * *